United States Patent [19]

Finelli et al.

[11] 4,221,646

[45] Sep. 9, 1980

[54] TREATED POLYETHERURETHANE PHOTOPOLYMER COMPOSITION CONTAINING TRIARYL PHOSPHINE

[75] Inventors: Anthony F. Finelli, Akron; Michael E. Kimball, Norton, both of Ohio

[73] Assignee: The Goodyear Tire & Rubber Company, Akron, Ohio

[21] Appl. No.: 902,011

[22] Filed: May 1, 1978

[51] Int. Cl.$^2$ .................. C08G 18/00; C08G 63/00
[52] U.S. Cl. ..................... 204/159.19; 204/159.18; 204/159.23; 204/159.16; 525/455; 528/67; 528/75; 430/284
[58] Field of Search .............. 204/159.23, 159.24, 204/159.18, 159.19; 96/115 P; 528/67, 75

[56] References Cited

U.S. PATENT DOCUMENTS

| | | | |
|---|---|---|---|
| 3,331,761 | 7/1967 | Mao | 204/159.23 |
| 3,933,682 | 1/1976 | Bean | 252/431 R |
| 4,057,431 | 11/1977 | Finelli et al. | 96/115 R |

*Primary Examiner*—Richard B. Turer
*Attorney, Agent, or Firm*—J. D. Wolfe

[57] ABSTRACT

An ultra violet light polymerizable composition composed of a water dispersible liquid ethylenically unsaturated polyetherurethane of 0.5 to 5 parts of a photoinitiator and 0.01 to 0.5 parts of triaryl phosphine, the preferred photoinitiator being mono- or di-alkoxy benzoin having alkoxy radicals containing 1 to 20 carbon atoms.

6 Claims, No Drawings

TREATED POLYETHERURETHANE PHOTOPOLYMER COMPOSITION CONTAINING TRIARYL PHOSPHINE

This invention relates to an improved liquid photopolymerizable ethylenically unsaturated polyetherurethane composition characterized by its ability to polymerize rapidly under ultra violet light activation to give a printing plate that is relatively resistant to the loss of its halftone dots during the printing operation.

Liquid photo-polymerizable ethylenically unsaturated polyetherurethanes that are readily water dispersible or dissolvable are disclosed in U.S. Pat. No. 4,057,431 and copending U.S. patent application of Shirish R. Jasani, having the Ser. No. 766,321, filed Feb. 7, 1977 now U.S. Pat. No. 4,139,436. These polyetherurethanes can be characterized generally as a reaction product of an organic polyisocyanate with a polyether polyol, preferably of 2 to 3 hydroxyls and a hydroxyl alkyl acrylate or methacrylate where the alkyl radical has from 1 to about 10 carbon atoms, and a photoinitiator. These polymers can be made by the prepolymer, one shot or quasiprepolymer methods.

In a more specific aspect, this is a liquid ethylenically unsaturated polyetherurethane composition having a viscosity at 24° C. of 1000 to 10,000 centipoises dispersible in dilute alkaline solutions (1 N-NaOH are preferred) that are capable of being polymerized by actinic light to yield a solid having a Shore A hardness of at least 30 when the composition contains 0.5 to 15 percent by weight of a dialkyl, aminoalkyl, acrylate or methacrylate with the alkyl radical containing 1 to 10 carbon atoms.

Although the polyetherurethanes described in these compositions produce satisfactory printing plates, they were subjected to the tendency to lose the half tone qualities on very long printing runs and tended to have soft or uncured properties in the center of the polymerizable mass unless it had been exposed to relatively long ultra violet light activation. Hence, this property of the polyetherurethanes convert into a time disadvantage when making printing plates or require the use of relatively more of the expensive photoinitiator.

It is an object of this invention to provide a liquid photo-polymerizable polyetherurethane composition that is characterized by the ability to produce printing plates having halftone dots that are very resistant to shearing off in use and that can be cured relatively rapidly.

The nature of this invention can be more readily understood by reference to the following examples wherein all parts and percentages are by weight unless otherwise indicated.

EXAMPLES I THROUGH VI

The base compositions were made by the recipes of Table 1:

Table 1

| Example No. | Parts | | | | | |
|---|---|---|---|---|---|---|
| | I | II | III | IV | V | VI |
| Polyether diol* | 2000 | 2000 | 1600 | 1600 | 800 | 800 |
| Isophorone diisocyanate | 883 | 883 | 772 | 772 | 175 | 189 |
| Trimethylhexamethylene diisocyanate | — | — | — | — | 166 | 178 |
| Hydroxyethyl methacrylate | 1101 | 1101 | 760 | 760 | 436 | 470 |
| Polyethylene glycol 600 dimethacrylate | 200 | 200 | 158 | 158 | 80 | 80 |
| Oleic Acid | 104 | 104 | 95 | 95 | 50 | 50 |
| Photosensitizer | BIBE | DEAP | BIBE | DEAP | BIBE | BIBE |
| Agent | 174 | 174 | 158 | 158 | 80 | 80 |
| Hydroquinone | 1.0 | 1.0 | 4.0 | 4.0 | 2 | 2 |
| Catalyst-T-831** | 4.0 | 4.0 | 3.0 | 3.0 | 1.5 | 1.5 |

*These polyether diols have molecular weights of 3000 in Examples I, II, V and VI and 1800 in Examples III and IV.
**Catalyst-T-831 is di(n-octyl)tin-S,S'-bis-(isooctyl mercaptoacetate).

In the table the recipe set forth for Examples I, II, V and VI were mixed in the following order, namely, the polyether diol was placed in a suitable reaction kettle, then the isocyanate and the polyethylene glycol 600 dimethacrylate, where the 600 indicates the molecular weight of the polyethylene glycol, along with the hydroquinone was added to the polyether diol. The mixture was degassed at room temperature for one hour and then the hydroxy ethyl methacrylate was added with stirring continuing for 10 minutes at atmospheric pressure. The catalyst was then added to the reactor and stirred for five minutes. The temperature of the reaction mixture was controlled by cooling the reaction vessel to see that the temperature did not rise above 77° C. The reaction mixture was allowed to stand for approximately 48 hours at room temperature after the exotherm had subsided and the resulting reaction product was analyzed for residual isocyanate content and usually was found to contain less than 0.5 percent free NCO. This free NCO content was then destroyed by the addition of the theoretical amount or a small excess of n-butanol to stabilize the viscosity of the resulting reaction product. For instance, the product obtained by Example I had a viscosity of 3200 centipoises at 24° C. after it had been stabilized by the addition of n-butanol and was substantially free of any offensive odor. The photosensitizing agent was added to this mixture in the amounts called for by the recipe and then the liquid photo-polymerizable composition, for instance, the one of Example I, was submitted to ultra violet cure and the cured composition had a Shore A hardness of 95. In Example IV the polyether diol, isophorone diisocyanate, hydroxyethyl methacrylate were first reacted to form the polyurethane and after standing for approximately 48 hours the free NCO was determined and destroyed by the addition of sufficient n-butanol to give a composition which was essentially free of isocyanate, then the oleic acid, polyethylene glycol 600 dimethacrylate and the photosensitizing agent, viz. DEAP, the abbreviation for 2,2-diethoxyacetophenone was added and stirred into the stabilized urethane mixture of Example IV to give a photopolymer composition having a viscosity of 4100 centipoises at 24° C. although this composition was substantially free of any offensive odor and could be readily cured upon exposure to ultra violet light to produce a polymer on the substrate that was satisfactory as a printing plate and by using an aqueous detergent solution the unpolymerizable composition was readily removed from the polymer on the substrate, it can be improved by treatment according to this invention.

In Examples I, II, III, IV and V above the polyether diol was one containing essentially 70 percent of the groups being derived from propylene oxide and 30 percent of its groups being derived from ethylene oxide and having approximately 80 percent primary hydroxyl groups. The polyether diol of Example VI contained approximately 92 percent groups derived from propylene oxide and 8 percent of groups derived from ethylene oxide to yield a diol having approximately 59 percent primary hydroxyl groups. The photosensitizer identified in Examples I, III, V and VI as BIBE is benzoin isobutyl ether.

The base compositions of Examples I and VI were modified by intimately mixing 9.0 percent by weight of diethyl amino ethyl acrylate to give a liquid photopolymerizable composition that produced printing plates having much improved halftone qualities, even dots less than 4 mils in diameter upon exposure to ultraviolet light. Although these compounded liquid photopolymerizable compositions were characterized by rapid polymerization and thus required shorter ultraviolet light exposure for development of the desired tonal qualities of the printing plate, they can be improved by treatment or compounding according to this invention.

When the printing plates of the aforesaid examples were examined under a microscope, the letters or dots were observed to be essentially straight up and down with a minimum of slope. It has been discovered that if the liquid polyetherurethane polymerizable mixture, i.e. the base polymer has 0.01 to 0.5 parts of an organic phosphine per 100 parts of base polymer, the amount of photoinitiator needed to obtain a fast and good cure is reduced. Thus, the resulting composition can be more economical. Also, it was discovered the microdots have a slope that gives the magnified dots a pyramid appearance and this shape gives a greatly improved printing plate which yields printed matter having an excellent frost line and other improved printed matter and service life. Thus by Gammatrol test this treatment gives improved frost line and free standing half tone dots.

The photoinitiators useful in this invention in combination with the organic derivatives of phosphine are the mono- and di-alkoxy benzoin derivatives where alkoxy contains 1 to 20 carbon atoms. Some representative preferred photoinitiators are benzoin isobutyl ether, 2,2-diethoxyacetophenone, bis-halomethyl benzophenone where the halo radical is chloro and 2,2-diethoxyphenyl acetophenone.

The benzoin type initiators are usually used in small amounts within the range of 0.01 to 5.0 parts with lower values being used where the liquid photopolymer composition is used with an opaque plastic such as the well known polyester film substrate that allows the liquid photopolymer composition to be exposed to ultra violet light from above and below the substrate. On the other hand, the higher amounts of initiator may be preferred for use where the substrate is metallic, viz. aluminum or plate grade steel.

For example, the polyetherurethanes of Table 1 preferably would be compounded with 2 to 5.0 parts per hundred parts by weight of DEAP and 0.01 to 0.1 part of triphenyl phosphine for use on a polyester substrate and then be given a 6-12 second bump exposure to a Mercury type ultra violet light followed by 50-60 second exposure to give a printing plate having improved anchoring of microdots to the substrate. Where the substrate is aluminum, preferably the composition of Table 1 are compounded with 0.5 to 1.5 parts of these photoinitiators and 0.25 to 0.5 parts of triaryl phosphine.

The photopolymer (100 parts) of Example I was mixed with 0.4 parts of methoxy benzoin. This mixture required an exposure for 25 seconds to a pulsed xenon arc light source to cure the liquid to a solid.

The same photopolymer (100 parts) containing 0.2 parts of methoxybenzoin and 0.04 parts of triphenyl phosphine cured to a solid upon only 10 seconds exposure to the same pulsed xenon arc light source.

The organic derivatives of phosphine useful in this invention have the general formula $PR_1R_2R_3$ wherein $R_1$, $R_2$ and $R_3$ can be identical or different and represent aliphatic, cycloaliphatic, aromatic, araliphatic or heterocyclic radicals—but one of the radicals $R_1$, $R_2$ or $R_3$ must always be an aromatic radical—and the percentages by weight mentioned relate to the total weight of unsaturated resin and copolymerizable monomers.

The following are representative phosphines useful in this invention:
triphenylphosphine
tri-p-toluyl-phosphine
diphenylmethyl-phosphine
diphenyl-ethyl-phosphine
diphenylpropyl-phosphine
dimethyl-phenyl-phosphine
diethylphenyl-phosphine
dipropyl-phenyl-phosphine
divinylphenyl-phosphine
divinyl-p-methoxyphenyl-phosphine
divinyl-p-bromophenyl-phosphine
divinyl-p-toluyl-phosphine
diallyl-phenyl-phosphine
diallyl-p-methoxyphenyl-phosphine
diallyl-p-bromophenyl-phosphine and
diallyl-p-toluyl-phosphine.

To a 100 parts of the liquid polyetherurethane photo composition of Examples I to VI, 0.2 parts of triphenyl phosphine was added and mixed. Then the sample was cured by exposure to a xenon arc light through a photonegative. It was observed that length of exposure to get a satisfactory cure was usually 5 to 20 seconds less than with the aliquot that did not contain the triphenyl phosphine. Also, the triphenyl phosphine treated sample yielded a superior printing plate.

The phosphines tabulated herein can be used to replace the triphenyl phosphine in the above experiments to obtain an improved printing plate.

Aliquots of the base compositions of Examples I to VI were modified by 9.0 percent by weight of diethyl amino-ethyl methacrylate thereto and thus adding additional ethylenic unsaturation besides that obtained by reacting an isocyanate radical of the prepolymer with hydroxyl alkyl acrylate or methacrylate where the alkyl radical contains 1, 2 to 10 and higher carbon atoms.

If triphenyl phosphine or tritoluyl phosphine are added to these additional ethylenic unsaturated aliquots in amounts of 0.15 to 0.25 with DEAP or 2,2-diethoxyphenyl acetophenone or bis chloromethyl benzophenone, the resulting photo composition is improved in frost line and half dot quality.

While certain representative embodiments and details have been shown for the purpose of illustrating the invention, it will be apparent to those skilled in this art that various changes and modifications may be made therein without departing from the spirit or scope of the invention.

What is claimed is:

1. In an ultra violet light polymerizable polyetherurethane composition composed of a dilute alkaline solution dispersible liquid ethylenically unsaturated polyetherurethane and 0.5 to 5.0 parts of a photoinitiator, the improvement comprising adding 0.01 to 0.5 parts of triaryl phosphine to the composition, said composition characterized to yield a printing plate having microdots having a slope which, under magnification, has an appearence essentially of a pyramid.

2. The composition of claim 1 wherein the photoinitiator is mono- or di-alkoxy benzoin and where the alkoxy radical contains 1 to 20 carbon atoms.

3. The composition of claim 1 wherein the triaryl phosphine is triphenyl phosphine.

4. The composition of claim 1 wherein at least part of the ethylenic unsaturation of the polyetherurethane is derived by reacting a hydroxyl alkyl acrylate or methacrylate with an isocyanate radical of the polyetherurethane.

5. The composition of claim 2 wherein at least part of the ethylenic unsaturation of the polyetherurethane is derived by reacting a hydroxyl alkyl acrylate or methacrylate with an isocyanate radical of the polyetherurethane.

6. The composition of claim 1 wherein the composition is water dispersible.

* * * * *